(12) United States Patent
Voogd et al.

(10) Patent No.: US 10,401,734 B2
(45) Date of Patent: Sep. 3, 2019

(54) LITHOGRAPHIC METHOD AND APPARATUS

(71) Applicant: ASML Netherlands B.V., Veldhoven (NL)

(72) Inventors: Robbert Jan Voogd, Achel (BE); Wilhelmus Jacobus Maria Rooijakkers, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/750,020

(22) PCT Filed: Jul. 25, 2016

(86) PCT No.: PCT/EP2016/067615
§ 371 (c)(1),
(2) Date: Feb. 2, 2018

(87) PCT Pub. No.: WO2017/032525
PCT Pub. Date: Mar. 2, 2017

(65) Prior Publication Data
US 2018/0224751 A1    Aug. 9, 2018

(30) Foreign Application Priority Data

Aug. 21, 2015 (EP) .................................... 15181900

(51) Int. Cl.
*G03F 7/20* (2006.01)
(52) U.S. Cl.
CPC ...... *G03F 7/70191* (2013.01); *G03F 7/70075* (2013.01); *G03F 7/7085* (2013.01);
(Continued)

(58) Field of Classification Search
CPC ............. G03F 7/70075; G03F 7/70116; G03F 7/70191; G03F 7/70508; G03F 7/70525;
(Continued)

(56) References Cited

U.S. PATENT DOCUMENTS 9,116,440 B2   8/2015   Hauf et al.
9,946,161 B2   4/2018   Saenger et al.
(Continued)

FOREIGN PATENT DOCUMENTS

DE    102009025362 A1    2/2010
DE    102012200370 A1    8/2013
(Continued)

OTHER PUBLICATIONS

International Search Report and Written Opinion of the International Searching authority directed to related International Patent Application No. PCT/EP2016/067615, dated Oct. 31, 2016; 11 pages.
(Continued)

*Primary Examiner* — Colin W Kreutzer
(74) *Attorney, Agent, or Firm* — Sterne, Kessler, Goldstein & Fox P.L.L.C.

(57) ABSTRACT

An illumination system (IL) for a lithographic apparatus comprising a polarization adjustment apparatus (15) arranged to receive linearly polarized radiation, the polarization adjustment apparatus comprising regions which are configured to rotate the polarization orientation by different amounts, a directing apparatus (6) operable to direct the radiation through one or more regions of the polarization adjustment apparatus, a controller (CN) configured to control the directing apparatus so as to control which of the one or more regions of the polarization adjustment apparatus radiation is directed through, wherein the controller is configured to limit which of the regions radiation is directed
(Continued)

through to one or more regions which rotate the orientation of the linear polarization by substantially the same amount, and a diffuser configured to receive radiation output from the polarization adjustment apparatus and increase a range of angles at which the radiation propagates while substantially conserving the polarization state of the radiation.

19 Claims, 5 Drawing Sheets (52) U.S. Cl.
CPC ...... *G03F 7/70116* (2013.01); *G03F 7/70508* (2013.01); *G03F 7/70525* (2013.01); *G03F 7/70566* (2013.01); *G03F 7/70591* (2013.01); *G03F 7/70716* (2013.01)

(58) Field of Classification Search
CPC ............. G03F 7/70566; G03F 7/70591; G03F 7/70716; G03F 7/7085
USPC ..................................................... 355/67, 71
See application file for complete search history.

(56) References Cited

U.S. PATENT DOCUMENTS

| | | |
|---|---|---|
| 2007/0171427 A1 | 7/2007 | Shiode |
| 2008/0062427 A1 | 3/2008 | Ohsaki et al. |
| 2009/0135397 A1* | 5/2009 | Fiolka ................. G03F 7/70108 355/71 |
| 2009/0262328 A1 | 10/2009 | Van Schoot et al. |
| 2009/0279066 A1 | 11/2009 | Tinnemans et al. |
| 2011/0063597 A1* | 3/2011 | Mengel ............... G03F 7/70116 355/71 |
| 2011/0228247 A1* | 9/2011 | Mulder ............... G03F 7/70116 355/71 |
| 2012/0092669 A1 | 4/2012 | Fiolka et al. |
| 2012/0249989 A1 | 10/2012 | Fujii |
| 2013/0021592 A1 | 1/2013 | Hempelmann et al. |
| 2013/0077077 A1 | 3/2013 | Saenger et al. |
| 2014/0285788 A1* | 9/2014 | Saenger ............... G03F 7/70191 355/71 |
| 2015/0160566 A1* | 6/2015 | Saenger ............... G03F 7/70116 355/71 |

FOREIGN PATENT DOCUMENTS

| | | |
|---|---|---|
| JP | 2007-048996 A | 2/2007 |
| JP | 2007-194537 A | 8/2007 |
| JP | 2009-267403 A | 11/2009 |
| JP | 2010-283101 A | 12/2010 |
| JP | 2012-506135 A | 3/2012 |
| JP | 2013-530526 A | 7/2013 |

OTHER PUBLICATIONS

International Preliminary Report on Patentability directed to related International Patent Application No. PCT/EP2016/067615, dated Feb. 27, 2018; 7 pages.

Bekaert et al., "Characterization and control of dynamic lens heating effects under high volume manufacturing conditions," Optical Microlithography XXIV, SPIE, vol. 7973, 2001; pp. 1-11.

* cited by examiner

LITHOGRAPHIC METHOD AND APPARATUS

CROSS-REFERENCE TO RELATED APPLICATIONS

This application claims priority of EP application 15181900.0 which was filed on 21 Aug. 2015 and which is incorporated herein in its entirety by reference.

FIELD

The present invention relates to a method for correcting polarization dependent optical effects. The method may be used in connection with a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Radiation that has been patterned by the mask is focussed onto the substrate using a projection system. The optical properties of the projection system may depend on the polarization state of the radiation which is projected by the projection system. It is desirable to determine the dependence of one or more optical properties of the projection system on the polarization state of the radiation which is projected by the projection system.

It is an object of the present invention to provide an apparatus and a method which at least partially address one or more of the problems of the prior art, whether identified herein or elsewhere.

SUMMARY

According to a first aspect of the invention, there is provided An illumination system for a lithographic apparatus, the illumination system comprising a polarization adjustment apparatus arranged to receive linearly polarized radiation, the polarization adjustment apparatus comprising regions which are configured to rotate the orientation of the linear polarization by different amounts, a directing apparatus operable to direct the linearly polarized radiation through one or more regions of the polarization adjustment apparatus, a controller configured to control the directing apparatus so as to control which of the one or more regions of the polarization adjustment apparatus radiation is directed through, wherein the controller is configured to limit which of the regions of the polarization adjustment apparatus radiation is directed through to one or more regions which are configured to rotate the orientation of the linear polarization by substantially the same amount, such that radiation which is output from the polarization adjustment apparatus has substantially a single linear polarization orientation and a diffuser configured to receive radiation output from the polarization adjustment apparatus and increase a range of angles at which the radiation propagates whilst substantially conserving the polarization state of the radiation.

The illumination system of the first aspect advantageously allows an end user of a lithographic apparatus to simply and conveniently probe a projection system with polarized radiation whose orientation is controllable. The polarization orientation of radiation which is output from the illumination system is advantageously controlled by controlling which of the one or more regions of the polarization adjustment apparatus the radiation is directed through. This provides a convenient way in which to control the polarization orientation without the need for extensive dedicated hardware. This may allow an end user of the illumination system to conveniently control the polarization orientation. Radiation which is output from the illumination system may be advantageously used to probe a projection system with radiation of varying polarization orientation. For example, which of the one or more regions of the polarization adjustment apparatus radiation is directed through may be changed in order to change the polarization orientation of radiation which is provided to a projection system. Changes in one or more optical properties of radiation which is output from the projection system may be measured with changes in the polarization orientation so as to derive polarization dependent properties of the projection system. For example, the diattenuation and/or the retardance of the projection system may be advantageously derived.

The diffuser advantageously increases the range of angles at which the radiation propagates so as to increase the extent of radiation in a pupil plane. The diffuser may, for example, increase the extent of radiation in a pupil plane such that the extent becomes substantially independent of the one or more regions of the polarization adjustment apparatus through which radiation is directed. For example, the diffuser may cause the radiation to substantially fill a pupil region in a pupil plane. Increasing the range of angles with which radiation propagates advantageously increases the extent of the lens elements of the projection system through which radiation passes. Increasing the range of angles additionally reduces the dependence of the regions of lens elements of the projection system through which radiation propagates on the orientation of an illumination mode which is formed by the illumination system. This advantageously allows more information about the polarization dependent properties of the projection system to be derived.

The controller may be operable to control the directing apparatus so as to change which of the one or more regions of the polarization adjustment apparatus radiation is directed through, thereby changing the linear polarization orientation of the radiation which is output from the polarization adjustment apparatus.

The controller may be operable to limit which of the regions of the polarization adjustment apparatus radiation is directed through to two diametrically opposed pole regions.

The controller may be operable to control the directing apparatus so as to rotate the pole regions about an optical axis.

The directing apparatus may comprise a plurality of reflective elements arranged to receive and reflect radiation, wherein the orientation of the plurality of reflective elements is adjustable in order to adjust the direction in which the radiation is reflected.

The controller may be configured to control the orientation of the plurality of reflective elements so as to control which of the one or more regions of the polarization adjustment apparatus radiation is directed.

The diffuser may be configured to increase the range of angles at which the radiation propagates so as to substantially fill an exit pupil of the illumination system with radiation having substantially a single polarization orientation.

The diffuser may comprise an optical element comprising a roughened surface configured to alter the direction of propagation of radiation which propagates through the roughened surface.

The optical element may comprise ground glass.

All or part of the polarization adjustment apparatus may be situated substantially in a pupil plane of the illumination system.

The polarization adjustment apparatus may comprise one or more optical elements formed of an optically active material configured to cause rotation of a linear polarization state, where the degree of rotation of the linear polarization state depends on the path length of radiation through the material.

The one or more optical elements may be shaped such that the one or more optical elements have different lengths at different regions so that the path length of radiation through the optically active material depends on the region at which the radiation is incident.

The polarization adjustment apparatus may be configured such that the degree of rotation of a linear polarization state which is caused by the polarization adjustment apparatus depends on an angular position about an optical axis of the polarization adjustment apparatus.

The polarization adjustment apparatus may be configured such that the degree of rotation of a linear polarization state which is caused by the polarization adjustment apparatus is symmetric about a line which passes through the optical axis of the polarization adjustment apparatus.

The polarization adjustment apparatus may be configured to rotate a linear polarization state such that the linear polarization state which is output from the polarization adjustment apparatus is perpendicular to a radial direction which extends outwardly from the optical axis of the polarization adjustment apparatus.

The polarization adjustment apparatus may be configured to rotate a linear polarization state such that the linear polarization state which is output from the polarization adjustment apparatus is parallel to a radial direction which extends outwardly from the optical axis of the polarization adjustment apparatus.

According to a second aspect of the invention there is provided a lithographic apparatus comprising an illumination system according to any preceding claim and arranged to provide a beam of radiation, a support structure for supporting a patterning device, the patterning device serving to impart the radiation beam with a pattern in its cross-section and a projection system for projecting the patterned radiation beam onto an image plane.

The lithographic apparatus may further comprise a sensor apparatus configured to measure one or more properties of radiation which is projected onto the image plane.

The sensor apparatus may be configured to measure the intensity of radiation which is projected onto the image plane.

The sensor apparatus may be configured to measure the relative phase of radiation which is projected onto the image plane.

The sensor apparatus may comprise a measurement patterning device held by the support structure.

The sensor apparatus may further comprise a sensor comprising an aperture or slit positioned substantially in the image plane and a radiation detector arranged to measure radiation transmitted through the aperture or slit.

The measurement patterning device may comprise an aperture or slit configured to transmit a measurement beam.

The sensor apparatus may further comprise a sensor comprising a diffraction grating positioned substantially in the image plane and a radiation detector arranged to measure radiation transmitted through the diffraction grating.

The measurement patterning device may comprise a diffraction grating configured to transmit a measurement beam.

According to a third aspect of the invention there is provided a method of controlling the polarization orientation of a radiation beam provided by an illumination system, the method comprising receiving linearly polarized radiation, directing, with a directing apparatus, the linearly polarization radiation through one or more regions of a polarization adjustment apparatus, wherein the polarization adjustment apparatus comprises regions which are configured to rotate the orientation of the linear polarization by different amounts, controlling the directing apparatus so as to control which of the one or more regions of the polarization adjustment apparatus radiation is directed through, wherein the directing apparatus is controlled to limit which of the regions of the polarization adjustment apparatus radiation is directed through to one or more regions which are configured to rotate the orientation of the linear polarization by substantially the same amount, such that radiation which is output from the polarization adjustment apparatus has substantially a single linear polarization orientation and diffusing radiation output from the polarization adjustment apparatus so as to increase a range of angles at which the radiation propagates whilst substantially conserving the polarization state of the radiation.

The method may further comprise controlling the directing apparatus so as to change which of the one or more regions of the polarization adjustment radiation is directed through, thereby changing the linear polarization orientation which is output from the polarization adjustment apparatus.

The method may further comprise directing radiation which is output from the illumination system through a projection system.

The method may further comprise measuring one or more properties of radiation which is output from the projection system.

The method may further comprise determining one or more properties of the projection system from the measurements.

The one or more properties may comprise a diattenuation of the projection system, which causes a particular transmittance that is dependent on the polarization state of the radiation.

The one or more properties may comprise retardance of the projection system, which causes a particular phase change that is dependent on the polarization state of the radiation.

Measuring one or more properties of radiation which is output from the projection system may comprise measuring the intensity of the radiation.

Measuring one or more properties of radiation which is output from the projection system may comprise measuring the relative phase of the radiation.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

An illumination system which is referred to herein may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1:
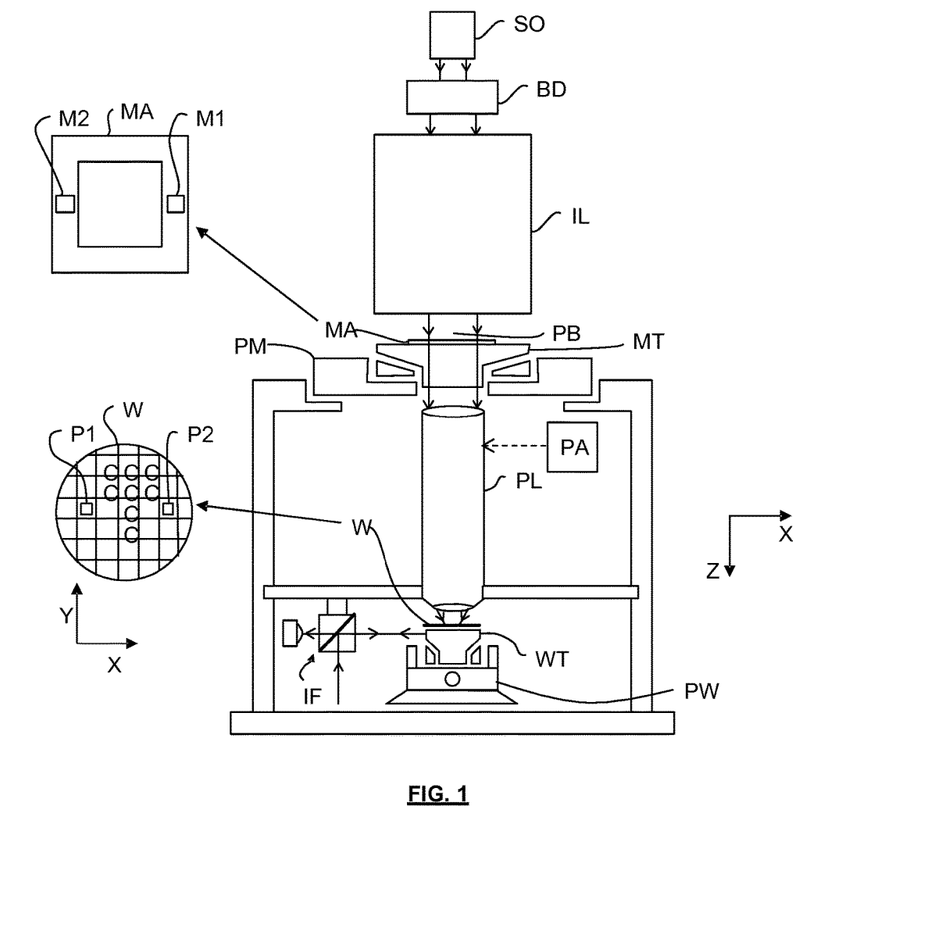
FIG. 1 is a schematic illustration of a lithographic apparatus according to an embodiment of the invention.

FIG. 1 schematically depicts a lithographic apparatus according to a particular embodiment of the invention. The apparatus comprises:

an illumination system (illuminator) IL to condition a beam PB of radiation (e.g. UV radiation, DUV or EUV radiation).

a support structure MT to support a patterning device (e.g. a mask) MA and connected to first positioning device PM to accurately position the patterning device with respect to item PL;

a substrate table (e.g. a wafer table) WT for holding a substrate (e.g. a resist coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illumination system IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system BD comprising for example suitable directing mirrors and/or a beam expander. In other cases the source may be an integral part of the apparatus, for example when the source is a mercury lamp. The source SO and the illumination system IL, together with the beam delivery system BD if required, may be referred to as a radiation system.

The illumination system IL may alter the intensity distribution of the beam. The illumination system IL may be arranged to limit the radial extent of the radiation beam such that the intensity distribution is non-zero within an annular region in a pupil plane of the illumination system IL. Additionally or alternatively, the illumination system IL may also be operable to limit the distribution of the beam in the pupil plane such that the intensity distribution is non-zero in a plurality of equally spaced sectors in the pupil plane. The intensity distribution of the radiation beam in a pupil plane of the illumination system IL may be referred to as an illumination mode.

The illumination system IL may comprise adjusting means for adjusting the intensity distribution of the beam. Generally, at least the outer and/or inner radial extent (commonly referred to as σ-outer and σ-inner, respectively) of the intensity distribution in a pupil plane of the illumination system can be adjusted. The illumination system IL may also be operable to vary the angular distribution of the beam. For example, the illumination system may be operable to alter the number, and angular extent, of sectors in the pupil plane wherein the intensity distribution is non-zero. By adjusting the intensity distribution of the beam in the pupil plane of the illumination system, different illumination modes may be achieved. For example, by limiting the radial and angular extent of the intensity distribution in the pupil plane of the illumination system IL, the intensity distribution may have a multi-pole distribution such as, for example, a dipole, quadrupole or hexapole distribution. In addition, the illumination system IL generally comprises various other components. The illumination system provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system PL has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PL as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PL will have a different Zernike expansion for each field point (i.e. for each spatial location in its image plane). The transmission map and the relative phase map may be determined by measurement of radiation which is projected through the projection system.

Measurements of the transmission map and the relative phase map may be used in order to adjust the projection system PL. For example, the projection system PL may comprise a plurality of lens elements and may further comprise adjusting means PA for adjusting the lens elements so as to correct for measured aberrations (phase variations across the pupil plane throughout the field). To achieve this, the adjusting means PA may be operable to manipulate lens elements within the projection system PL in one or more different ways. The projection system may have a co-ordinate system wherein its optical axis extends in the z direction. The adjusting means PA may be operable to do any combination of the following: displace one or more lens elements; tilt one or more lens elements; and/or deform one or more lens elements. Displacement of lens elements may be in any direction (x, y, z or a combination thereof). Tilting of lens elements is typically out of a plane perpendicular to the optical axis, by rotating about axes in the x or y directions although a rotation about the z axis may be used for non-rotationally symmetric aspherical lens elements. Deformation of lens elements may include both low frequency shapes (e.g. astigmatic) and high frequency shapes (e.g. free form aspheres). Deformation of a lens element may be performed for example by using actuators to exert force on sides of the lens element and/or by using heating elements to heat selected regions of the lens element. In general, it may not be possible to adjust the projection system PL to correct for apodizations (transmission variation across the pupil plane). The transmission map of a projection system PL may be used when designing masks MAs for the lithographic apparatus LA. Using computational lithography techniques, the masks MAs may be designed to at least partially correct for apodizations.

The illumination system IL may be operable to alter the polarization of the beam PB and may be operable to adjust the polarization using a polarization adjustment apparatus. The polarization state of the radiation beam across a pupil plane of the illumination system IL may be referred to as a polarization mode. The use of different polarization modes may allow greater contrast to be achieved in the image formed on the substrate W. The polarization direction of the radiation beam may vary across a pupil plane of the illumination system IL. The polarization direction of radiation may be different in different regions in the pupil plane of the illumination system IL. The polarization state of the radiation may be chosen in dependence on the illumination mode. For example, for multi-pole illumination modes the polarization of each pole of the radiation beam may be generally perpendicular to the position vector of that pole in the pupil plane of the illumination system IL.

One or more optical properties of the projection system PL may depend on the polarization state of the radiation which is projected through the projection system PL. For example, the transmission of the projection system PL may depend on the polarization state of the radiation. Additionally or alternatively the relative phase of radiation at the substrate W (wavefront aberrations) may depend on the polarization state of the radiation which is projected through the projection system PL.

The polarization state of a coherent polarized electromagnetic wave may be represented by a two component complex vector, known as the Jones vector. In general, the polarization state of electromagnetic radiation may be represented by an ellipse in a plane perpendicular to the propagation direction, which is a locus of points traced out by the electric field vector of the radiation as it propagates. If the relative phase of the two components of the Jones vector is zero, the Jones vector represents linearly polarized radiation. If the Jones vector has two components of equal magnitude and a relative phase difference of $\pm\pi/2$, the Jones vector represents circularly polarized radiation. Jones vectors live in a vector space spanned by the polarization states of polarized radiation. Therefore, ignoring depolarization effects, the polarization state of an electromagnetic wave exiting an optical system may be expressed as a product of a Jones matrix for that optical system with the Jones vector for the polarization state of the electromagnetic wave entering the optical system. The Jones matrix is a 2×2 complex matrix and therefore contains 8 scalar parameters. In general, the Jones matrix will vary across the pupil plane of the optical system. A Jones pupil may be defined as a set of Jones matrices for different parts of the pupil and field planes. The Jones pupil defines the dependence of the optical properties (e.g. transmission and phase) of a projection system PL on the polarization state of the radiation which is projected through the projection system PL at all points in the pupil and field planes of the projection system PL.

Various different parameterisations of the 8 scalar components of a Jones matrix have been proposed. One such parameterisation uses the singular value decomposition to express the Jones matrix for an optical system as a product of terms in terms corresponding to the following five well defined optical elements: (a) partial polarizers, (b) rotators, (c) retarders, (d) a scalar phase (phase plate) and (e) a scalar transmission (grey filter). The scalar phase and transmission have been described above in relation to unpolarized radiation whereas the first three optical elements produce additional polarization dependent effects. A partial polarizer results in diattenuation, wherein the transmission of the optical element is dependent upon the orientation of the polarization state of radiation entering the element. A rotator is an optical element that rotates a given polarization state. A retarder results in birefringence, wherein, in general, the relative phases of different components of the polarization state will change.

In particular, it can be shown that an arbitrary Jones matrix may be decomposed as the product of a scalar transmission, a scalar phase, a Jones matrix for a general partial polarizer and the Jones matrix for a general retarder. The Jones matrices for a retarder and a partial polarizer each have two mutually perpendicular eigenvectors. In general, these eigenvectors will be Jones vectors corresponding to elliptically polarized radiation. Assuming that the ellipticities of the eigenstates of the partial polarizer and the retarder in this decomposition are negligible (which has been found to be a good approximation for lithographic projection systems), a general Jones matrix J may be written as:

$$J=te^{i\Phi}J_{pol}(d,\theta) \cdot J_{ret}(\varphi,\beta), \tag{1}$$

where t is a scalar transmission, $\Phi$ is a scalar phase, $J_{pol}(d,\theta)$ is the Jones matrix for a partial polarizer and $J_{ret}(\varphi,\beta)$ is the Jones matrix for a retarder. Therefore, the Jones matrix factorises as a product of polarization dependent ($J_{pol}$ and $J_{ret}$) and polarization independent (t and $\Phi$) parts. In this approximation, the Jones matrix can be well described using 6 scalar parameters. Note that even if the assumption that the two elipticity parameters are small did not hold, their effects can be separated and treated separately from the above parameters.

Retardation or partial polarization may be represented by a Jones matrix, as described above. Retardation alters the relative phase of two separate components of the Jones vector whereas partial polarization alters the relative magnitudes of the two separate components. The above mentioned Jones matrices for a retarder $J_{ret}(\varphi,\beta)$ and a partial polarizer $J_{pol}(d,\theta)$ each have two mutually perpendicular eigenvectors that represent orthogonal linearly polarized radiation states. In the case of a retarder, these represent fast and slow axes whereas in the case of a partial polarizer, they represent bright and dark axes. In each case, the effect of the Jones matrix on the polarization state of electromagnetic radiation is described by: a parameter ($\varphi$ or d) which describes how the two eigenstates of the Jones matrix are effected; and a parameter ($\beta$ or $\theta$) which describes the angle in real space between the two eigenstates and the axes of the coordinate system onto which the electromagnetic radiation state has been projected. Therefore, both retardation and partial polarization can be represented by a magnitude and an angle and can therefore formally be represented by a two dimensional vector.

Since the polarization state of radiation which is projected through the projection system PL may be varied by the illumination system IL it is desirable to determine the dependence of the optical properties of the projection system PL on the polarization state of the radiation which is projected through the projection system PL. As was described above, the dependence of the optical properties of the projection system PL on the polarization state of the radiation which is projected through the projection system PL may be referred to as the Jones pupil of the projection system PL. Knowledge of the Jones pupil of the projection system PL may be used to adjust the projection system PL according to the polarization mode which is formed by the illumination system IL. For example, if the polarization mode which is formed by the illumination system IL is changed, then the projection system PL may be adjusted in order to compensate for the dependence of the optical properties of the projection system PL on the polarization state of the radiation which is projected through the projection system PL.

All or part of the Jones pupil of the projection system PL may be determined by projecting radiation of varying polarization through the projection system PL and measuring the resultant change in properties of the radiation which is output from the projection system PL. For example, linearly polarized radiation may be projected through the projection system PL and the orientation of the linear polarization state may be rotated. Radiation which is output from the projection system may be measured and changes in the measured radiation with changes in the polarization state may be used to determine all or part of the Jones pupil.

Typically, the Jones pupil of a projection system PL is determined by using dedicated hardware. For example, complex dedicated optical components which do not normally form part of a lithographic apparatus may be used to probe the projection system PL with radiation of varying polarization states. The dedicated hardware may be used to determine the Jones pupil of the projection system PL shortly after manufacture of the projection system PL but may not be available for subsequent determination of the Jones pupil. For example, a lithographic apparatus may be provided to an end user with information related to the Jones pupil of the projection system PL but the end user may not have any means for determining the Jones pupil of the projection system PL themselves. Consequently any variations in the Jones pupil of the projection system PL may go undetected.

The Jones pupil of a projection system PL may, for example, change over time due to changes in the optical properties of lens elements which form the projection system PL. Additionally or alternatively one or more optical components (e.g. a lens element) of the projection system PL may be changed which may affect the Jones pupil of the projection system PL as a whole. Without any means of determining the Jones pupil of the projection system PL, an end user of a lithographic apparatus may have no way of accounting for the changes in the Jones pupil. The end user may instead have to rely on Jones pupil information which is provided to them upon delivery of a lithographic apparatus.

It is desirable to provide a means of determining all or part of the Jones pupil of a projection system which may enable an end user of a lithographic apparatus to perform the determination. In particular, it is desirable to provide a means of determining all or part of the Jones pupil of the projection system without the need for extensive dedicated hardware which does not normally form part of a lithographic apparatus. According to an embodiment of the invention an illumination system IL is provided with apparatus for providing a projection system PL with linearly polarized radiation. The orientation of the linear polarization state may be varied by the illumination system IL so as to vary the polarization state of the radiation which is provided to the projection system PL. Radiation which is output from the projection system PL may be measured and changes in one or more properties of the output radiation with changes in the polarization state of the radiation may be used to derive all or part of the Jones pupil of the projection system PL. An illumination system IL which includes apparatus suitable for providing the projection system PL with radiation having a variable linear polarization state may advantageously allow all or part of the Jones pupil of the projection system PL to be easily determined by an end user of a lithographic apparatus.

Figure 2:
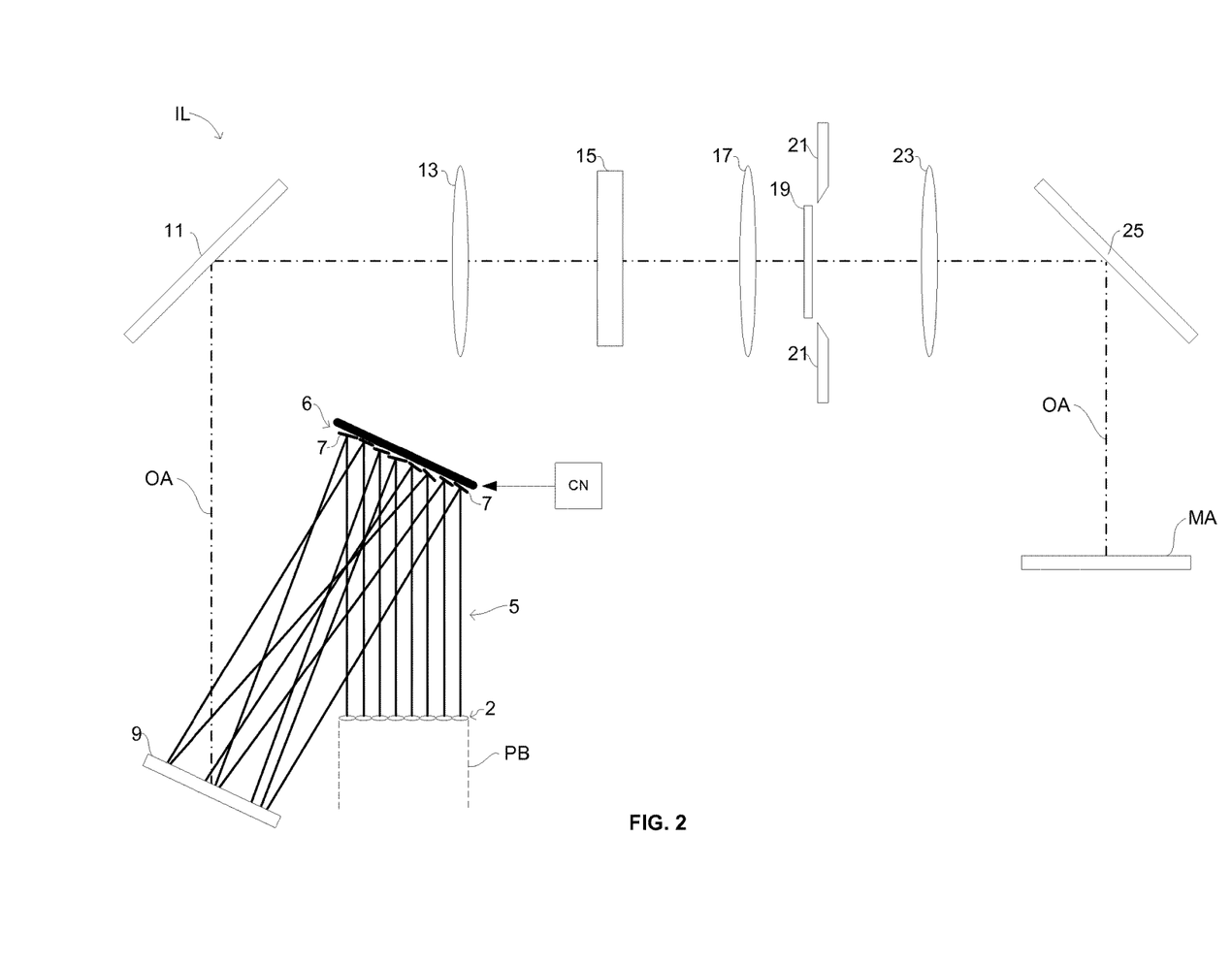
FIG. 2 is a schematic illustration of an illumination system according to an embodiment of the invention, which may form part of the lithographic apparatus of FIG. 1.

FIG. 2 is a schematic illustration of an illumination system IL according to an embodiment of the invention. The illumination system IL is provided with a radiation beam PB, for example, from a radiation source SO (not shown in FIG. 2). The radiation beam PB is incident on a lens array 2. The lens array 2 comprises a plurality of lens elements which each receive a portion of the radiation beam PB and focus the portion of the radiation beam PB to form a sub-beam. The plurality of lens elements thereby forms a plurality of sub-beams 5 which are incident on a mirror array 6. The mirror array 6 comprises a plurality of individually controllable reflective elements 7 whose orientation may be adjusted. The orientation of the reflective elements 7 may be adjusted in order to control the direction in which each of the sub-beams 5 are directed. The orientation of the reflective elements 7 is controlled by a controller CN. The controller CN may, for example, provide control signals to one or more actuators (not shown) which are arranged to change the orientation of the reflective elements 7 in response to the control signals.

The sub-beams 5 are directed to be incident on a first mirror 9. For ease of illustration the sub-beams 5 (which together form a radiation beam) are not shown in FIG. 2 after having been incident on the first mirror 9. It will however be appreciated that a radiation beam formed from overlapping sub-beams 5 propagates through the illumination systems generally along an optical axis OA of the illumination system IL. The radiation beam is incident on a second mirror 11 which directs the radiation beam to a first focussing optic 13. The first focusing optic 13 may, for example, comprise a Fourier lens which focuses the radiation beam onto a polarization adjustment apparatus 15. A second focusing element 17 focuses the radiation beam through a diffuser 19 and in between field shaping elements 21. A third focussing optic 23 focuses the radiation beam onto a third mirror 25 so as to form an image at a patterning device MA which lies in an image plane of the illumination system IL.

In general the illumination system IL may form one or more field planes which are conjugate optical planes to the image plane in which the patterning device MA lies. The illumination system IL may also form one or more conjugate pupil planes. A pupil plane may be considered to be an optical plane having a Fourier relationship with a field or image plane in that the spatial intensity profile of radiation in a pupil plane determines the angular intensity profile of radiation in an field or image plane.

The illumination system which is presented in FIG. 2 is merely an illustrative example of an illumination system IL. An illumination system IL may include more optical components than are shown in FIG. 2, may include different components than are shown in FIG. 2 and/or the optical components of an illumination system may be arranged differently than is shown in FIG. 2.

The illumination system IL is configured to form a desired spatial and angular intensity profile of radiation at the patterning device MA which lies in an image plane of the illumination system IL. The spatial and angular intensity profile of the radiation which at the patterning device MA may be referred to as an illumination mode. The illumination mode which is formed by the illumination system IL may be controlled by controlling the orientation of the plurality of reflective elements 7 which form the mirror array 6. For example, the plurality of reflective elements 7 may be orientated so as to direct the sub-beams 5 through different optical paths through the illumination system IL such that the radiation which is incident on the patterning device MA has a desired spatial and angular intensity profile.

In some illumination modes the orientation of the plurality of reflective elements 7 may be controlled so as to limit the angular extent of radiation which is incident on the patterning device MA. Limiting the angular extent of radiation in an image or field plane of the illumination system IL corresponds to limiting the spatial extent of radiation in a pupil plane of the illumination system IL. For example, the orientation of the plurality of reflective elements 7 may be controlled so as to form a so-called multi-pole illumination mode in which the spatial regions in the pupil plane in which the radiation intensity is non-zero is limited to two or more pole regions.

Figure 3:
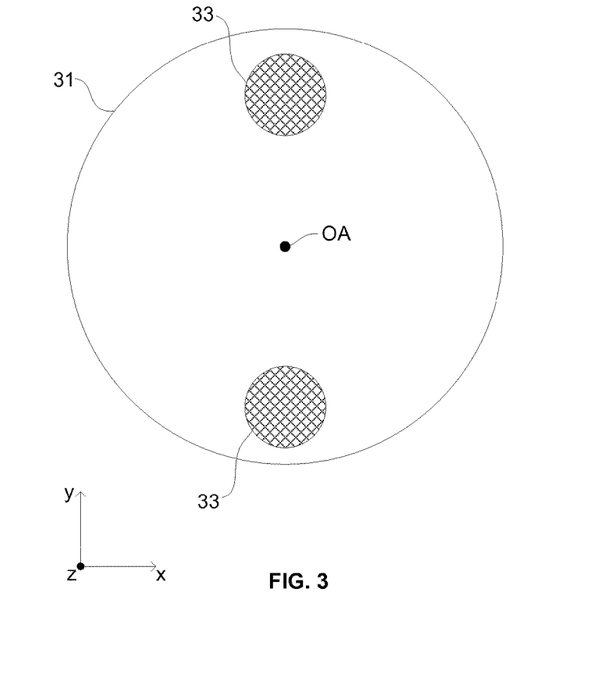
FIG. 3 is a schematic representation of an illumination mode which may be formed by the illumination system of FIG. 2.

FIG. 3 is a schematic representation of the intensity distribution of radiation in a pupil plane 31 when the illumination system IL forms a dipole illumination mode. The dipole illumination mode consists of two diametrically opposed pole regions 33 in which the radiation intensity is non-zero. Also shown in FIG. 3 is a Cartesian x and y co-ordinates. The y-direction shown in FIG. 3 denotes a scanning direction in which the patterning device MA is scanned relative to the substrate W and the x-direction denotes a non-scanning direction which is perpendicular to the scanning direction. Also shown in FIG. 3 is a z-direction which extends out of the page of FIG. 3. The z-direction corresponds with the direction in which the optical axis OA of the illumination system IL extends.

It will be appreciated, for example, from FIG. 2 that the radiation beam undergoes reflections in the illumination system at which the optical axis OA is rotated. The co-ordinate system which is referred to herein and which is shown in the Figures is considered to follow the optical axis OA of the illumination system IL and undergo rotations with the optical axis OA. The z-direction is thus considered to be aligned with the optical axis OA at all positions in the illumination system IL despite the optical axis OA undergoing one or more rotations in the illumination system IL.

In the dipole illumination mode which is shown in FIG. 3 the pole regions 33 are aligned with the y-direction. For this reason the dipole illumination mode which is shown in FIG. 3 may be referred to as a y-dipole. Other dipole illumination modes may be formed in which the pole regions 33 are aligned in other directions. For example, an x-dipole mode may be formed in which the pole regions 33 are aligned in the x-direction.

As was described above, a polarization adjustment apparatus 15 is situated between the first focussing element 13 and the second focussing element 17. The polarization adjustment apparatus 15 may be situated substantially in a pupil plane 31 of the illumination system IL. The polarization adjustment apparatus 15 is configured to adjust the polarization state of the radiation beam which propagates through it.

The radiation beam which is provided to the illumination system IL (for example, from a radiation source SO) may be linearly polarized. For example, the linear polarization direction of the radiation may be aligned with the y-direction, may be aligned with the x-direction or may form an angle with the x and y-directions. The optical elements on which the radiation beam B is incident on its optical path to the polarization adjustment apparatus 15 may generally conserve the polarization state of the radiation beam. The radiation beam B which is incident on the polarization adjustment apparatus 15 may therefore be linearly polarized.

The polarization adjustment apparatus 15 is configured to rotate the linear polarization state which is incident upon it. In particular, the polarization adjustment apparatus 15 may be configured to rotate the linear polarization state which is incident upon it by different amounts depending on the spatial location at which it is incident. The polarization adjustment apparatus 15 may, for example, comprise an optically active material which causes a rotation of a linear polarization state, where the degree of rotation of the linear polarization state depends on the path length of the radiation through the material. The degree of rotation of the linear polarization state of radiation of a given wavelength may, for example, be approximately proportional to the path length of radiation through the optically active material. In an embodiment the polarization adjustment apparatus 15 comprises crystalline quartz. In other embodiments the polarization adjustment apparatus 15 may comprise one or more different optically active materials.

A length along the optical axis OA of an optically active material which forms the polarization adjustment apparatus 15 may be different at different x and y-positions. For example, the optically active material may be formed from one or more wedge shaped sections. If the length along an optical axis OA of the optically active material is different at different x and y-positions then the path length of radiation through the optically active material depends on the x and y-position at which the radiation is incident on the optically active material. Consequently the degree of rotation which a linear polarization state undergoes depends on the x and y-position.

Figure 4A:
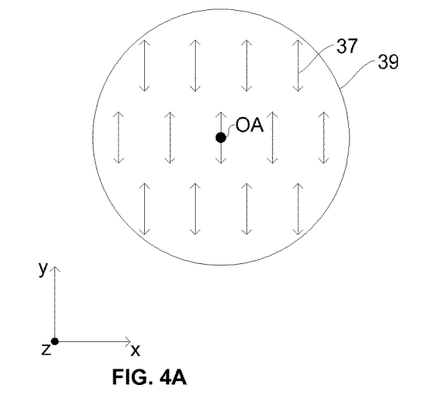
FIGS. 4A and 4B are schematic representations of polarization states of a radiation beam before and after adjustment by a polarization adjustment apparatus.
Figure 4B:
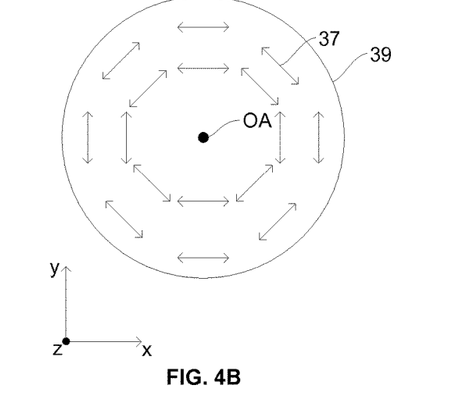

In some embodiments the polarization adjustment apparatus 15 may be configured to form a polarization mode in which the polarization direction depends on an angular position in an x-y plane. FIGS. 4A and 4B are schematic representations of a polarization state of a radiation beam before and after passing through a polarization adjustment apparatus 15. Double-headed arrows 37 which are shown in FIGS. 4A and 4B denote the orientation of linear polarization at different x and y positions.

FIG. 4A shows an input linear polarization state in which the polarization direction is aligned with the y-direction at all x and y positions. FIG. 4B shows a polarization state of a radiation beam B after the radiation beam B has passed through a polarization adjustment apparatus 15. In the embodiment which is shown in FIG. 4B, the polarization orientation is substantially perpendicular to a radial direction extending outwardly from the optical axis OA. That is, the polarization orientation is a function of the angular position with respect to the optical axis OA. The polarization state which is shown in FIG. 4B may be referred to as a transverse electric (TE) polarization state.

In some embodiments the polarization adjustment apparatus 15 may be configured to form a TE polarization mode in a pupil plane of the illumination system IL. As was described above the polarization adjustment apparatus 15 may comprise an optically active material configured to rotate the polarization direction of radiation as a function of the path length of the radiation through the optically active material. The polarization adjustment apparatus 15 may be configured to have different thicknesses at different angular positions with respect to the optical axis OA so as to cause different degrees of rotation of the polarization state at different angular positions.

In some embodiments the polarization adjustment apparatus may be a single optical element (e.g. a suitably shaped optically active material). In other embodiments the polarization adjustment apparatus 15 may comprise a plurality of optical elements. For example, the polarization adjustment apparatus 15 may comprise a first optical element which is configured to cause a first change in the polarization state of a radiation beam and a second optical element which is configured to cause a second change in the polarization state of the radiation beam. In some embodiments the polarization adjustment apparatus 15 may comprise more than two optical elements configured to adjust the polarization state of a radiation beam. In embodiments in which the polarization adjustment apparatus 15 comprises a plurality of optical elements, the different optical elements may be situated adjacent to one another (for example, near to a pupil plane of the illumination system IL). In other embodiments different optical elements which form a polarization adjustment apparatus 15 may be situated at different positions in the illumination system IL. In general the polarization adjustment apparatus 15 comprises one or more optical elements which are configured to provide a polarization state in which an orientation of linear polarization is different at different positions in an x-y plane.

In the representation which is shown in FIGS. 4A and 4B the radiation beam is considered to substantially fill a pupil region 39. However, as was described above, the plurality of reflective elements 7 may be orientated such that the spatial intensity profile of radiation in a pupil plane is limited to one or more discrete regions in which the radiation intensity is non-zero. For example, the plurality of reflective elements 7 may be orientated so as to form a dipole illumination mode in which the spatial intensity profile in a pupil plane is limited to two diametrically opposed pole regions in which the radiation intensity is non-zero (as shown in FIG. 3).

If a polarization adjustment apparatus 15 is situated in a pupil plane of the illumination system and the plurality of reflective elements are orientated so as to limit the extent of the pupil plane in which the intensity of radiation is non-zero, then the range of polarization orientations of the radiation which is output from the polarization adjustment apparatus 15 may be limited. Consequently the polarization orientation of radiation which is output from the polarization adjustment apparatus 15 may be controlled by controlling the regions of the polarization adjustment apparatus 15 through which radiation is directed (i.e. controlling the illumination mode which is formed by the plurality of reflective elements 7). This may be illustrated with reference to FIG. 5.

Figure 5:
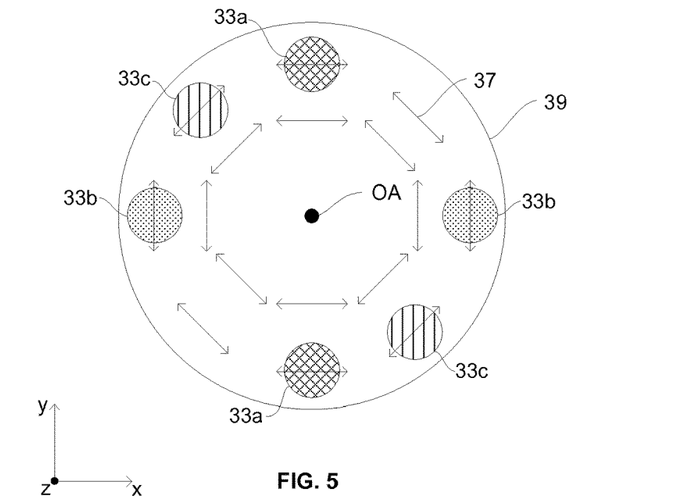
FIG. 5 is a schematic representation of a plurality of different illumination modes and polarization states which may be formed by the illumination system of FIG. 2.

FIG. 5 is a schematic representation of different dipole modes which may be formed in a pupil plane of the illumination system IL. Also shown in FIG. 5 are double-headed arrows 37 representing a TE polarization mode which the polarization adjustment apparatus 15 may be configured to form in the pupil plane. As will be described further below, in a TE polarization mode the polarization orientation is symmetric across the pupil region 39 such that two diametrically opposed dipole regions have substantially the same polarization.

Cross-hatched dipole regions 33a which are shown in FIG. 5 represent a y-dipole illumination mode in which the dipoles 33a are aligned in the y-direction. It can be seen from FIG. 5 that both dipole regions 33a which form a y-dipole illumination mode have a linear polarization which is aligned with the x-direction. Also shown in FIG. 5 are dotted dipole regions 33b which represent an x-dipole illumination mode in which the dipoles 33 are aligned in the x-direction. It can be seen from FIG. 5 that both dipole regions 33b which form an x-dipole illumination mode have a linear polarization which is aligned with the y-direction. Also shown in FIG. 5 are hatched dipole regions 33c which represent a third dipole illumination mode in which the dipoles 33c are aligned at approximately 45° to both the x and y-directions. It can be seen from FIG. 5 that both dipole regions 33c which from the third illumination mode have a linear polarization which is aligned at approximately 45° to both the x and y-directions.

It can be seen from FIGS. 4B and 5 that a TE polarization mode has a reflection symmetry about any line which extends across the diameter of the pupil region 39 and through the optical axis OA. Due to the symmetry of a TE polarization mode, any dipole illumination mode which comprises diametrically opposed dipole regions (e.g the x-dipole, y-dipole and third dipole illumination modes which were described above with reference to FIG. 5) have substantially the same polarization orientation in each dipole region. However, since the x-dipole, y-dipole and third dipole illumination modes comprise dipole regions which are located at different x and y-positions to each other, the polarization orientations of the three dipole illumination modes are different from each other. The polarization orientation of radiation which is output from the illumination system IL may therefore be changed by rotation of a dipole illumination mode (e.g. from an x-dipole illumination mode to a y-dipole illumination mode or the third illumination mode or vice versa).

It will be appreciated that in addition to the three dipole illumination modes which are shown in FIG. 5, other dipole illumination modes may be formed comprising dipole regions which are aligned differently than is shown in FIG. 5. In general, any orientation of dipoles may be formed which may allow any output polarization orientation to be selected. The polarization orientation of radiation which is output from the illumination system IL may therefore be controlled by controlling the orientation of a dipole illumination mode. For example, a dipole illumination mode may be rotated (e.g. from an x-dipole illumination mode towards a y-dipole illumination mode) in order to rotate the polarization state of the radiation which is output from the illumination system IL.

The polarization state of the radiation which is output from the illumination system may be changed (e.g. by rotating a dipole illumination mode as described above) in order to probe the projection system PL with different polarization states. For example, the polarization state of the radiation which is output from the illumination system IL may be changed and one or more properties of the radiation which is output from the projection system PL may be measured in order to derive the dependency of the one or more optical properties on the polarization state. In this way all or part of the Jone's pupil of the projection system PL may be determined.

Changing the polarization orientation of the radiation which is output from the illumination system by changing the orientation of a dipole illumination mode as was described above is advantageous since it may be performed using apparatus which is already included in an illumination system IL. For example, an illumination system IL may already include a polarization adjustment apparatus 15 and may already include a plurality of reflective elements 7 whose orientation may be controlled in order to control an illumination mode which is formed by the illumination system IL. An end user of a lithographic apparatus LA may therefore change the polarization orientation of radiation which is output from the illumination system IL simply by changing the orientation of the reflective elements 7 so as change the orientation of a dipole illumination mode. This may allow the end user to probe the projection system PL with different polarization states without the need for further dedicated hardware.

As was explained above, the spatial intensity distribution of radiation in a pupil plane of the illumination system IL, determines the angular intensity profile of radiation in a field or image plane of the illumination system IL. In a dipole illumination mode the spatial intensity profile is limited to two pole regions in a pupil plane. Consequently the angular intensity profile in a field or image plane is limited to two angular regions. In the absence of any further optical elements, the radiation which propagates through the projection system PL when a dipole illumination mode is used may therefore be limited in its angular and spatial extent. Consequently radiation may only propagate through limited regions of lens elements which form the projection system PL. Furthermore, the regions of the lens elements through which radiation does propagate may change with changes in the orientation of a dipole.

If radiation only propagates through limited regions of lens elements which form the projection system PL, then information which is obtained about the polarization dependent properties of the projection system PL may be limited to given regions of the lens elements. Furthermore, dependence of the regions of the lens elements through which radiation propagates on the orientation of a dipole may make it difficult to separate polarization dependent effects from other effects. For example, any changes which are measured in the optical properties of radiation which is output from the projection system PL with changes in the dipole orientation may be due to changes in the regions of the lens elements through which the radiation propagates or may be due to changes in the polarization state of the radiation. Consequently it may be difficult to determine the polarization dependent properties of the projection system PL.

For at least the reasons set out above it is desirable to increase the extent of regions of lens elements of the projection system PL through which radiation propagates when determining polarization dependent properties of the projection system PL. Furthermore, it is desirable to reduce the dependence of the regions of lens elements of the projection system PL through which radiation propagates on the orientation of an illumination mode (e.g. a dipole illumination mode) when determining polarization dependent properties of the projection system PL. In order to achieve these aims a diffuser 19 is situated in the optical path of radiation through the illumination system IL as is shown in FIG. 2.

The diffuser 19 is configured to increase the range of angles at which the radiation propagates, whilst conserving the polarization state of the radiation. That is, the diffuser 19 is configured to increase the range of angles which the radiation forms with the optical axis OA whilst conserving the polarization state of the radiation. The diffuser may, for example, comprise an optical element comprising a roughened surface which is configured to alter the direction of propagation of radiation as it propagates through the roughened surface.

In some embodiments the diffuser 19 comprises a piece of ground glass. Ground glass includes a roughened surface which may, for example, be formed by sandblasting the surface. As radiation propagates through the roughened surface the direction of propagation of the radiation is altered. Alteration of the direction of propagation of radiation through the roughened surface may be different for different rays of radiation which pass through the roughened surface, thereby causing the range of angles which the rays of radiation form with the optical axis OA to increase.

In other embodiments the diffuser 19 may comprise one or more optical elements other than a piece of ground glass. In some embodiments the diffuser 19 may, for example, comprise a holographic diffuser. A holographic diffuser may comprise a material (e.g. a polycarbonate material) on which a holographic etch is formed. A ground glass diffuser and a holographic diffuser are examples of so-called surface diffusers which cause diffusion due to scattering effects at a surface. In general surface diffusers conserve the polarization state of radiation. The use of a surface diffuser may therefore be preferable in embodiments of the invention. In general, the diffuser 19 may comprise any optical element or combination of optical elements which are configured to increase the range of angles at which the radiation propagates whilst conserving the polarization state of the radiation.

In some embodiments, the diffuser 19 may be arranged in between a pupil plane and a field plane of the illumination system IL. For example, the diffuser 19 may be positioned slightly before or after a field plane of the illumination system IL. In the embodiment which is shown in FIG. 2, the diffuser is positioned slightly before the field shaping elements 21. The field shaping elements 21 may be positioned substantially in a field plane of the illumination system IL. The field shaping elements 21 may be movable with respect to the optical axis OA so as to define an outer limit of the radiation beam B in a field plane. The position of the field shaping elements 21 may therefore be controlled in order to control the shape of the radiation beam in a field plane.

In general it may be preferable to position the diffuser 19 close to a field plane of the illumination system IL in order to scatter radiation throughout a pupil region of the illumination system IL. Moving a diffuser 19 closer to a field plane will advantageously increase the degree of scattering of radiation which is seen in the pupil plane. However, if the diffuser 19 is placed in a field plane then the structure of the diffuser 19 (e.g. a rough surface) may be imaged into a field or image plane of the illumination system IL. It may therefore be desirable to position the diffuser 19 slightly before or slightly after a field plane so as to provide good scattering of the radiation in a pupil plane whilst avoiding imaging the structure of the diffuser into a field or image plane.

Figure 6A:
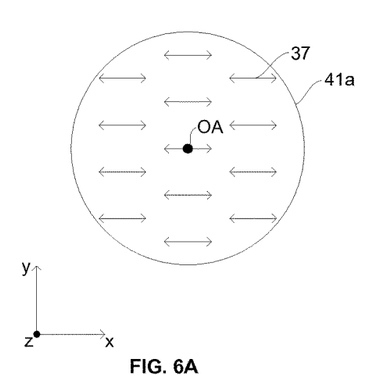
FIGS. 6A, 6B, 6C are schematic representations of the polarization states of an exit pupil of the illumination system of FIG. 2.
Figure 6B:
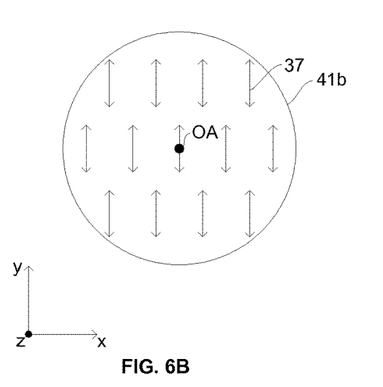
Figure 6C:
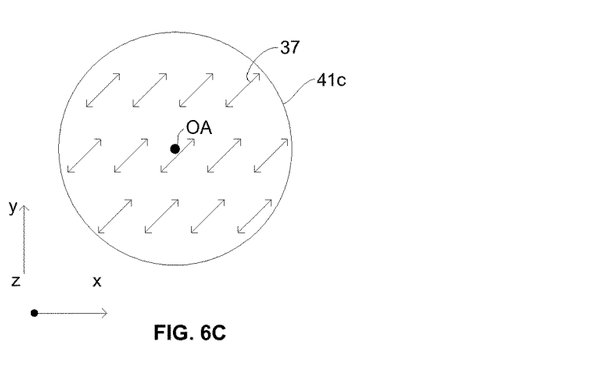

The diffuser 19 may increase the range of angles which the radiation forms with the optical axis OA to such an extent that the radiation substantially fills an exit pupil of the illumination system IL. FIGS. 6A-6C are schematic representations of exit pupils 41a-41c of the illumination system IL having different polarization states. The exit pupil 41a which is shown in FIG. 6A comprises radiation having a polarization which is aligned with the x-direction. The exit pupil 41a shown in FIG. 6A may, for example, result from forming the y-dipole illumination mode 33a shown in FIG. 5 and passing the illumination mode through a diffuser 19. The exit pupil 41b which is shown in FIG. 6B comprises radiation having a polarization which is aligned with the y-direction. The exit pupil 41b shown in FIG. 6B may, for example, result from forming the x-dipole illumination mode 33b shown in FIG. 5 and passing the illumination mode through a diffuser 19. The exit pupil 41c which is shown in FIG. 6C comprises radiation having a polarization which is aligned at approximately 45° with respect to the x and y-directions. The exit pupil 41c shown in FIG. 6C may, for example, result from forming the third dipole illumination mode 33c shown in FIG. 5 and passing the illumination mode through a diffuser 19.

Whilst three exit pupils 41a-41a are shown in FIGS. 6A-6C having three distinct polarization states, other exit pupils with different polarization states may instead be formed. For example, using a polarization adjustment apparatus 15 configured to form a TE polarization mode, forming a dipole and passing the illumination mode through a diffuser 19 as was described above may allow an exit pupil having any desirable linear polarization orientation to be formed by rotation of the dipole illumination mode to select the desired polarization orientation.

Figure 7:
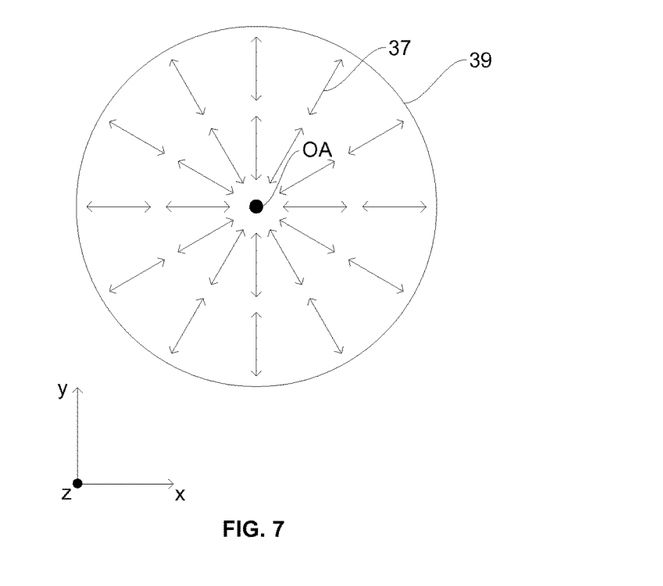
FIG. 7 is a schematic representation of an alternative embodiment of a polarization state of a radiation beam which may be formed by a polarization adjustment apparatus.

Whilst embodiments have been described above in which the polarization adjustment apparatus is configured to form a TE polarization mode, in other embodiments the polarization adjustment apparatus may be configured to form other polarization modes. FIG. 7 is a schematic representation of a polarization mode which may be formed by an alternative embodiment of a polarization adjustment apparatus. The double-headed arrows 37 in FIG. 7 denote the polarization orientation at different x and y-positions. Similarly to the TE polarization mode which is shown in FIG. 4B, in the polarization mode which is shown in FIG. 7, the polarization orientation is a function of an angular position with respect to the optical axis OA. In particular, the polarization state is substantially parallel with a radial direction which extends outwardly from the optical axis OA at all positions. The polarization mode which is shown in FIG. 7 may be referred to as a transverse magnetic (TM) polarization mode.

As is the case with a TE polarization mode, a TM polarization mode as shown in FIG. 7 has reflection symmetry about any line which extends across the diameter of the pupil region 39 and through the optical axis OA. Consequently if a dipole illumination mode which comprises two diametrically opposed dipole regions in a pupil plane is formed, then the two dipole regions will have substantially the same polarization orientation. The polarization orientation of the dipole regions may be changed by rotating the dipole regions about the optical axis OA. A polarization adjustment apparatus which is configured to form a TM polarization mode as shown in FIG. 7 may therefore be used in a similar way to a polarization adjustment apparatus configured to form the TE polarization mode described above, in order to control the linear polarization orientation which is output from the illumination system IL by rotation of a dipole illumination mode about the optical axis OA.

In other embodiments, a polarization adjustment apparatus may be configured to form polarization states other than the TE and TM polarization states described above. In general a polarization adjustment apparatus may be configured to form any polarization state which comprises linearly polarized radiation whose orientation is different at different positions in a plane which is perpendicular to the optical axis OA of the illumination system (e.g. in a pupil plane of the illumination system IL). The polarization adjustment apparatus may be any optical element or combination of optical elements which are arranged to receive linearly polarized radiation and are configured to rotate the orientation of the linear polarization differently at different positions.

As was described above, the controller CN may control the orientation of the plurality of reflective elements 7 so as to control the directions in which radiation is directed and control the regions of the polarization adjustment apparatus through which radiation is directed. Whilst specific reference has been made to a plurality of reflective elements 7 being used to direct radiation through the polarization adjustment apparatus, in other embodiments different apparatus may be used to direct radiation through one or more regions of the polarization adjustment apparatus. In general any directing apparatus may be used which is operable to direct linearly polarized radiation through one or more regions of a polarization adjustment apparatus. A controller CN is configured to control the directing apparatus so as to control the one or more regions of the polarization adjustment apparatus through which radiation is directed. In particular, the controller CN may be configured to limit the regions of the polarization adjustment apparatus through which radiation is directed to one or more regions which are configured to rotate the orientation of a linear polarization state by substantially the same amount. As a result the radiation which is output from the polarization adjustment apparatus has substantially the same linear polarization state.

In some embodiments, the polarization state of radiation which is output from the polarization adjustment apparatus is a strong function of the position at which the radiation is incident on the polarization adjustment apparatus. If, for example, one or more pole regions are formed and directed through the polarization adjustment apparatus, then radiation throughout a pole region may have substantially the same polarization state after being output from the polarization adjustment apparatus. However, different portions of a pole region pass through slightly different portions of the polarization adjustment apparatus. As a result small differences may exist in the polarization state of different portions of a pole region which is output from the polarization adjustment apparatus. Reference is therefore made herein to radiation having substantially the same polarization orientation or substantially a single polarization orientation in order to account for small differences in polarization state which may exist due to small differences in the path which radiation takes through the polarization adjustment apparatus.

As was described briefly above, changing the polarization state of the radiation which is output from the illumination system IL and input to the projection system PL may allow the dependence of the transmission of the projection system PL on the polarization state of the radiation to be determined. Changes in the transmission of the projection system PL with changes in polarization may be referred to as diattenuation. Additionally or alternatively changing the polarization state of the radiation which is output from the illumination system IL and input to the projection system PL may allow the dependence of the phase of radiation which is output from the projection system PL on the polarization state of the radiation to be determined. Changes in phase with changes in polarization may be referred to as retardation.

The transmission of the projection system may be measured by measuring the intensity of radiation which is output from the projection system using one or more sensors. In some embodiments a sensor set up which may be referred to as a transmission image sensor may be used. A transmission image sensor may include a measurement patterning device which is positioned in an image plane of the illumination system (e.g. in the position of the patterning devices MA which are shown in FIGS. 1 and 2). The measurement patterning device may include one or more parallel slits or apertures in the measurement patterning device which transmit radiation to allow the transmitted radiation to enter the projection system PL. Radiation which is transmitted at an aperture or slit in a measurement patterning device may be referred to as a measurement beam. A measurement patterning device may include a series of apertures or slits so as to form a series of measurement beams which are projected through the projection system PL.

One or more sensors may be arranged to receive one or more measurement beams which are output from the projection system PL. A sensor may comprise one or more detector regions, where each detector region comprises a transmissive aperture or slit arranged to receive and transmit a measurement beam and a radiation detector arranged to receive the transmitted measurement beam. The one or more apertures or slits may be positioned substantially in an image plane of the projections system PL. The one or more radiation detectors may be positioned substantially in a pupil plane of the projection system PL. The one or more radiation detectors are configured to measure the intensity of a measurement beam from which the transmission of the projection system may be derived.

In some embodiments multiple measurement beams may be formed at a measurement patterning device and measured at multiple detector regions. The measurement of multiple measurement beams may allow the transmission of the projection system PL to be determined at multiple locations in a field or image plane of the projection system PL.

As was described above the transmission of the projection system PL may be measured for multiple different polarization states in order to determine the diattenuation of the projection system PL. The diattenuation may be determined at multiple different locations in a field or image plane of the projection system PL.

Figure 8:
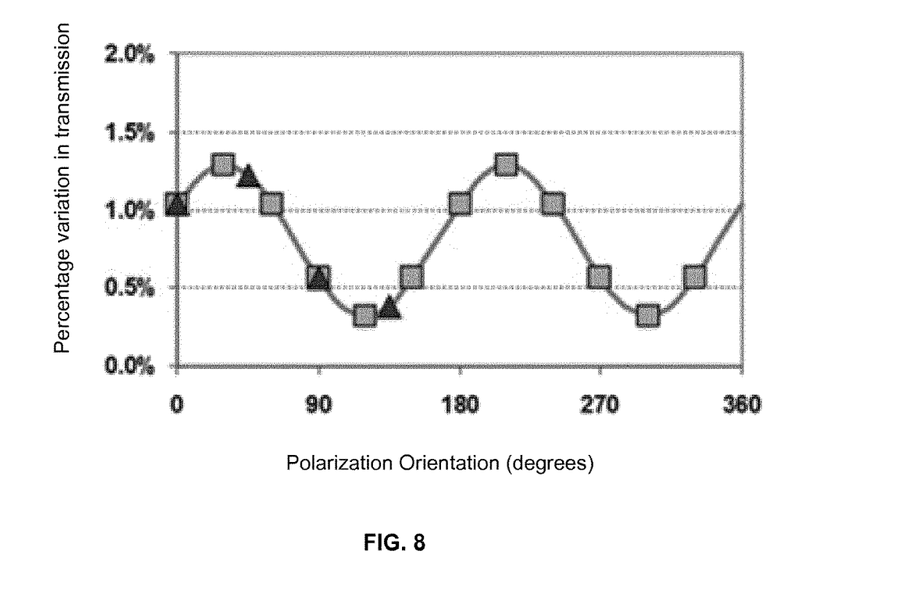
FIG. 8 is a schematic representation of the percentage variation in transmission of a projection system which results from a rotation of a polarization orientation.

FIG. 8 is a schematic representation of the percentage variation in transmission of a projection system PL as a function of the orientation (given in degrees) of a linear polarization state which is projected through the projection system. The squares and triangles which are shown in FIG. 8 represent measurements made at different polarization orientations. It can be seen from FIG. 8 that the transmission of the projection system PL periodically increases and decreases as the polarization orientation is rotated. The fluctuation of the transmission of the projection system PL is generally sinusoidal in nature. A sinusoidal curve which is fitted to the measured data is also shown in FIG. 8.

As was mentioned above, additionally or alternatively to the measurement of diattenuation, the dependence of the relative phase of radiation projected through the projection system on the polarization state of radiation may be determined. The relative phase may be measured using shearing interferometry measurements. Shearing interferometry measurements may, for example, be performed by using a measurement patterning device which comprises one or more transmissive diffraction gratings. The measurement patterning device may be positioned in an image plane of the illumination system IL. Radiation which is transmitted at the one or more diffraction gratings forms one or more measurement beams which are projected by the projection system PL onto an image plane of the projection system PL. One or more sensors may be arranged to receive and measure the one or more measurement beams which are output from the projection system PL.

A sensor may comprise one or more detector regions each comprising a transmissive diffraction grating and a radiation sensor arranged to receive and measure a measurement beam transmitted at the diffraction grating. The radiation sensor may be configured to measure the power of radiation incident on the radiation sensor as a function of position. In some embodiments a sensor may comprise an array of detector elements (e.g. a CCD array) positioned behind a series of diffraction gratings which each transmit a measurement beam. The power of each measurement beam which is transmitted by the diffraction gratings may be measured as a function of position at the array of detector elements.

In order to derive phase information, the sensor and/or the measurement patterning device may be stepped and/or scanned relative to each other so as to change their relative positioning. Changes in the measured radiation at the one or more radiation sensors which result from relative movement of the measurement patterning device and/or the sensor may be used to derive information about the relative phase of radiation which is incident on the sensor. In some embodiments the measurement patterning device and/or the sensor may be moved relative to each other in more than one direction. This may allow information about a full two-dimensional wavefront to be derived from the measurements. Wavefront measurements may be performed at several different detector regions which are located at several different positions in an image plane of the projection system PL. This may allow wavefront information to be determined at different positions in an image plane of the projection system PL.

Wavefront measurements such as those described above using shearing interferometry may be performed for several different polarization orientations. This may allow the dependence of wavefront aberrations on the polarization orientation to be determined. In an analogous fashion to the diattenuation measurements described above wavefront measurements may be performed at a series of different polarization orientations and the measurements may be fitted to a sinusoidal curve for all polarization orientations.

In some embodiments the same sensor set up may be used to determine the transmission of the projection system PL as is used to determine the relative phase of the projected radiation.

In some embodiments, measurements may be made using multiple different polarization adjustment apparatus configurations. For example, a polarization adjustment apparatus which is configured to form a TE polarization mode may initially be used and the orientation of a dipole illumination mode may be altered to output different linear polarization orientations. Measurements of the transmission and/or output phase of the projection system PL may be measured at each different output linear polarization orientation. Subsequently further measurements at different output linear polarization orientations may be made by using a polarization adjustment apparatus which is configured to form a TM polarization mode. Measurements made using a polarization adjustment apparatus configured to form a TM polarization mode may be compared to measurements made using a polarization adjustment apparatus configured to form a TE polarization mode. Such a comparison may provide information about any potential influence of a particular polarization adjustment apparatus on the measurements made.

In some embodiments the configuration of the illumination system IL may be adjusted so as to output unpolarized radiation. For example, one or more optical elements which are configured to depolarize radiation may be placed in the optical path of radiation which propagates through the illumination system IL. Measurements of the radiation which is output from the projection system PL may be made and may be compared to measurements made when linearly polarized radiation is output from the illumination system IL. This may allow the effects of polarization changes to be separated from optical effects other than polarization dependent effects. For example, the projection system PL may cause phase aberrations and/or may attenuate radiation due to optical effects which do not depend on the polarization state of the radiation. Measurements using unpolarized radiation may be compared to measurements made using polarized radiation so as to separate the polarization dependent effects from the non-polarization dependent effects.

Wavefront and transmission measurements which are performed for a plurality of different polarization states may be used to derive retardation and diattenuation maps of the projections system PL respectively. The retardation and diattenuation maps of the projection system PL contain at least some of the important parameters which are needed to determine how the polarization of an input radiation beam will be altered by the projection system PL. The retardation and diattenuation maps of the projection system may be stored in a memory. The memory may for example form part of, or be associated with, the lithographic apparatus which contains the projection system PL. The retardation and diattenuation maps of the projection system may subsequently be retrieved from the memory.

During subsequent use of a lithographic apparatus different illumination modes and/or different polarization modes may be used to illuminate a patterning device MA so as to impart a pattern onto a substrate W. The retardation and diattenuation maps of the projection system PL may be used to determine suitable configurations of lens elements of the projection system PL for different illumination modes and/or different polarization modes. The lens elements of the projection system may be adjusted using the adjusting means PA in order to bring about the determined configurations of the lens elements.

In some embodiments only one of the diattenuation or the retardation of the projection system PL is determined. In other embodiments both the diattenuation and the retardation of the projection system PL is determined.

While specific embodiments of the invention have been described above, it will be appreciated that the invention may be practiced otherwise than as described. The description is not intended to limit the invention.

The invention claimed is:

1. An illumination system for a lithographic apparatus, the illumination system comprising:
    a polarization adjustment apparatus comprising regions configured to rotate an orientation of linear polarization of linearly polarized radiation by different amounts;
    a directing apparatus configured to direct the linearly polarized radiation through one or more regions of the polarization adjustment apparatus;
    a controller configured to control the directing apparatus so as to control which of the one or more regions of the polarization adjustment apparatus the linearly polarized radiation is directed through, wherein the controller is further configured to limit which of the regions of the polarization adjustment apparatus the linearly polarized radiation is directed through to one or more regions configured to rotate the orientation of the linear polarization by substantially the same amount, such that radiation output from the polarization adjustment apparatus has substantially a single linear polarization orientation; and
    a diffuser configured to receive the radiation output from the polarization adjustment apparatus and increase a range of angles at which the received radiation propagates so as to substantially fill an exit pupil of the illumination system whilst substantially conserving the single linear polarization orientation.

2. The illumination system of claim 1, wherein the controller is configured to control the directing apparatus so as to change which of the one or more regions of the polarization adjustment apparatus the linearly polarized radiation is directed through, thereby changing the single linear polarization orientation.

3. The illumination system of claim 1, wherein the controller is configured to limit which of the regions of the polarization adjustment apparatus the linearly polarized radiation is directed through to two diametrically opposed pole regions.

4. The illumination system of claim 3, wherein the controller is configured to control the directing apparatus so as to rotate the two diametrically opposed pole regions about an optical axis.

5. The illumination system of claim 1, wherein all or part of the polarization adjustment apparatus is situated substantially in a pupil plane of the illumination system.

6. The illumination system claim 1, wherein the polarization adjustment apparatus comprises one or more optical elements comprising an optically active material configured to cause rotation of a linear polarization state, where a degree of the rotation of the linear polarization state depends on the path length of radiation through the optically active material.

7. The illumination system of claim 1, wherein the polarization adjustment apparatus is configured such that a degree of rotation of a linear polarization state which is caused by the polarization adjustment apparatus depends on an angular position about an optical axis of the polarization adjustment apparatus.

8. The illumination system of claim 1, wherein the polarization adjustment apparatus is configured such that a degree of rotation of a linear polarization state caused by the polarization adjustment apparatus is symmetric about a line which passes through the optical axis of the polarization adjustment apparatus.

9. A lithographic apparatus comprising:
an illumination system configured to provide a beam of radiation, the illumination system comprising:
a polarization adjustment apparatus comprising regions configured to rotate an orientation of linear polarization of linearly polarized radiation by different amounts;
a directing apparatus configured to direct the linearly polarized radiation through one or more regions of the polarization adjustment apparatus:
a controller configured to control the directing apparatus so as to control which of the one or more regions of the polarization adjustment apparatus the linearly polarized radiation is directed through, wherein the controller is further configured to limit which of the regions of the polarization adjustment apparatus the linearly polarized radiation is directed through to one or more regions configured to rotate the orientation of the linear polarization by substantially the same amount, such that radiation output from the polarization adjustment apparatus has substantially a single linear polarization orientation;
a diffuser configured to receive the radiation output from the polarization adjustment apparatus and increase a range of angles at which the received radiation propagates so as to substantially fill an exit pupil of the illumination system whilst substantially conserving the single linear polarization orientation;
a support structure configured to support a patterning device configured to pattern the beam; and
a projection system for projecting the patterned beam onto an image plane.

10. The lithographic apparatus of claim 9, further comprising a sensor apparatus configured to measure a property of radiation projected onto the image plane to determine a property of the projection system based on a change of a property of radiation passed through the projection system.

11. A method of controlling and characterizing a radiation beam provided by an illumination system, the method comprising:
directing, using a directing apparatus, linearly polarized radiation through one or more regions of a polarization adjustment apparatus comprising regions that rotate an orientation of linear polarization of the linearly polarized radiation by different amounts;
controlling the directing apparatus so as to control which of the one or more regions of the polarization adjustment apparatus radiation is directed through, wherein the directing comprises limiting which of the regions of the polarization adjustment apparatus the linearly polarized radiation is directed through to one or more regions that rotate the orientation of the linear polarization by substantially the same amount, such that radiation output from the polarization adjustment apparatus has substantially a single linear polarization orientation;
receiving the radiation output from the polarization adjustment apparatus using a diffuser; and
increasing a range of angles at which the received radiation propagates, using the diffuser, so as to substantially fill an exit pupil of the illumination system whilst substantially conserving the single linear polarization orientation.

12. The method of claim 11, further comprising controlling the directing apparatus so as to change which of the one or more regions of the polarization adjustment apparatus the linearly polarized radiation is directed through, thereby changing the single linear polarization orientation.

13. The method of claim 11, further comprising:
directing radiation output from the illumination system to pass through a projection system,
measuring a property of the radiation passed through the projection system using a sensor apparatus, and
determining a property of the projection system based on a change of the property of the radiation passed through the projection system.

14. The method of claim 13, wherein the property of the projection system comprises a diattenuation and the determining is further based on a change of polarization-dependent transmittance of the radiation passed through the projection system.

15. The lithographic apparatus of claim 10, wherein the property of the projection system comprises a dependence of an optical property of the projection system on a polarization state of the radiation passed through the projection system.

16. The lithographic apparatus of claim 10, wherein the property of the projection system comprises diattenuation and the determining is further based on a change of polarization-dependent transmittance of the radiation passed through the projection system.

17. The lithographic apparatus of claim 10, wherein the property of the projection system comprises retardance and the determining is further based on a polarization-dependent phase change of the radiation passed through the projection.

18. The method of claim 13, wherein the property of the projection system comprises a dependence of an optical property of the projection system on a polarization state of the radiation passed through the projection system.

19. The method of claim 13, wherein the property of the projection system comprises retardance and the determining is further based on a polarization-dependent phase change of the radiation passed through the projection.

* * * * *

UNITED STATES PATENT AND TRADEMARK OFFICE
CERTIFICATE OF CORRECTION

PATENT NO.         : 10,401,734 B2                                    Page 1 of 1
APPLICATION NO.    : 15/750020
DATED              : September 3, 2019
INVENTOR(S)        : Voogd et al.

It is certified that error appears in the above-identified patent and that said Letters Patent is hereby corrected as shown below:

In the Claims

In Claim 9, Column 25, Line 31, please delete ":" and insert --;--.

Signed and Sealed this
First Day of December, 2020

Andrei Iancu
*Director of the United States Patent and Trademark Office*